United States Patent
Kang et al.

(10) Patent No.: US 8,253,127 B2
(45) Date of Patent: Aug. 28, 2012

(54) ORGANIC LIGHT-EMITTING DEVICE HAVING IMPROVED LIGHT-EMITTING EFFICIENCY AND METHOD FOR FABRICATING THE SAME

(75) Inventors: Min-Soo Kang, Daejeon Metropolitan (KR); Jeoung-Kwen Noh, Daejeon Metropolitan (KR); Yun-Hye Hahm, Daejeon Metropolitan (KR); Jung-Bum Kim, Daejeon Metropolitan (KR); Jong-Seok Kim, Seoul (KR); Jung-Hyoung Lee, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 12/449,349

(22) PCT Filed: Feb. 5, 2008

(86) PCT No.: PCT/KR2008/000752
§ 371 (c)(1),
(2), (4) Date: Sep. 9, 2009

(87) PCT Pub. No.: WO2008/097046
PCT Pub. Date: Aug. 14, 2008

(65) Prior Publication Data
US 2010/0320446 A1  Dec. 23, 2010

(30) Foreign Application Priority Data
Feb. 5, 2007 (KR) .................. 10-2007-0011512

(51) Int. Cl.
*H01L 21/00* (2006.01)

(52) U.S. Cl. ...... 257/40; 257/72; 257/414; 257/E51.018
(58) Field of Classification Search .............. 257/40.49, 257/94, 98, 414, E21.569–589, 23.175, 29.184; 438/144–156
See application file for complete search history.

(56) References Cited

U.S. PATENT DOCUMENTS

| | | | | |
|---|---|---|---|---|
| 6,593,689 B2* | 7/2003 | Hayashi et al. | | 313/504 |
| 6,818,328 B2* | 11/2004 | Utsumi et al. | | 428/690 |
| 6,993,214 B2* | 1/2006 | Nishimura et al. | | 385/14 |
| 7,119,409 B2* | 10/2006 | Kawamura et al. | | 257/414 |
| 7,227,306 B2* | 6/2007 | Park et al. | | 313/506 |
| 2005/0225232 A1 | 10/2005 | Boroson et al. | | |
| 2005/0249972 A1 | 11/2005 | Hatwar et al. | | |
| 2006/0097264 A1 | 5/2006 | Kim et al. | | |
| 2006/0192220 A1 | 8/2006 | Nishikawa et al. | | |
| 2006/0192471 A1 | 8/2006 | Inoue et al. | | |
| 2007/0013302 A1* | 1/2007 | Song et al. | | 313/506 |

(Continued)

FOREIGN PATENT DOCUMENTS
CN  1599526 A  3/2005
(Continued)

*Primary Examiner* — Michael Lebentritt
(74) *Attorney, Agent, or Firm* — McKenna Long & Aldridge LLP

(57) ABSTRACT

The present invention provides an organic light emitting device in which a layer having a refractive index in the range of 1.3 to 3 is further formed on an upper electrode of at least one region of regions through which rays having red, green, and blue colors are passed and a method of manufacturing the organic light emitting device. An optical length that can cause the microcavity effect according to the type of color of emitted light is controlled by using the layer to manufacture the organic light emitting device having high light emitting efficiency.

18 Claims, 2 Drawing Sheets

U.S. PATENT DOCUMENTS

2008/0067921 A1 * 3/2008 D'Andrade et al. .......... 313/504

FOREIGN PATENT DOCUMENTS

| JP | 11-224783 A | 8/1999 |
|---|---|---|
| JP | 2006-236916 | 9/2006 |
| JP | 2006-244712 | 9/2006 |
| JP | 2006-338954 | 12/2006 |
| JP | 2007-012370 | 1/2007 |
| KR | 10-2006-0042728 | 2/2007 |
| KR | 10-2007-0008215 | 8/2008 |

* cited by examiner

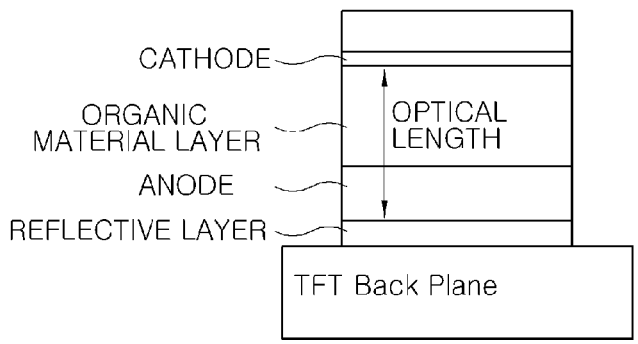
[Fig. 1]
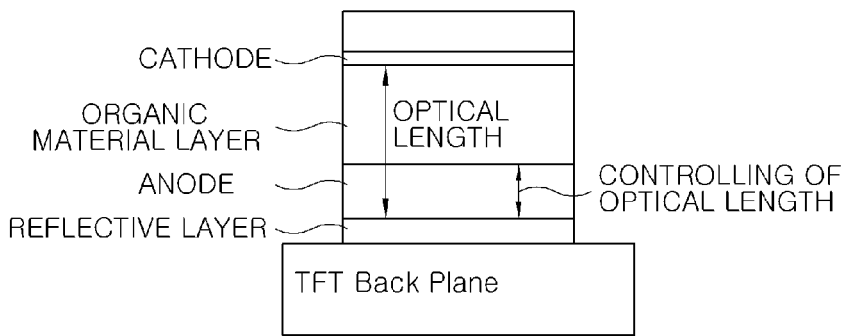
[Fig. 2]
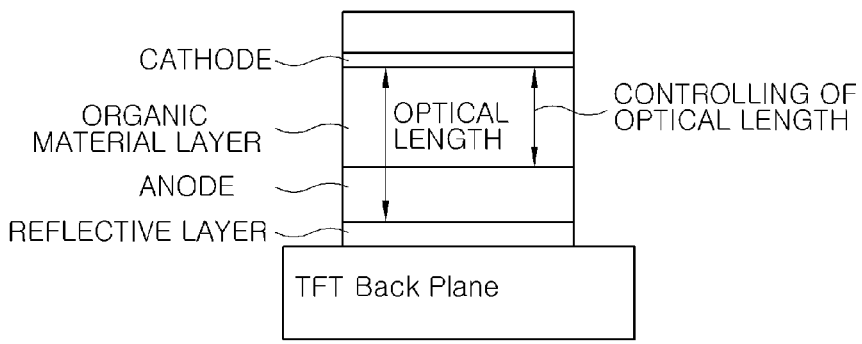
[Fig. 3]
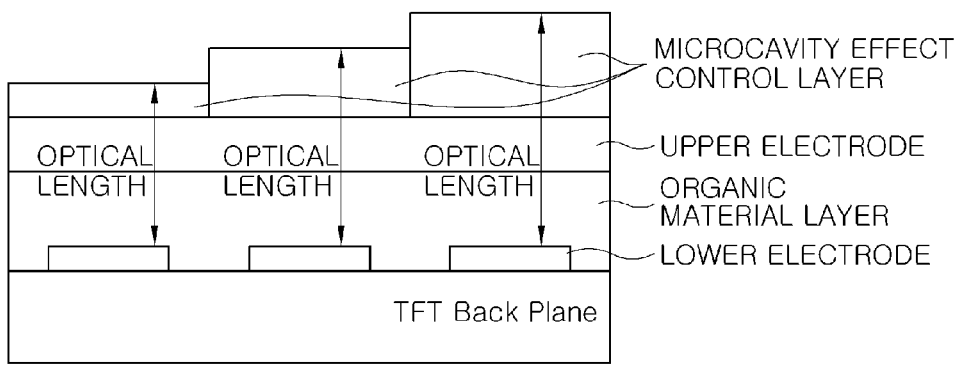
[Fig. 4]

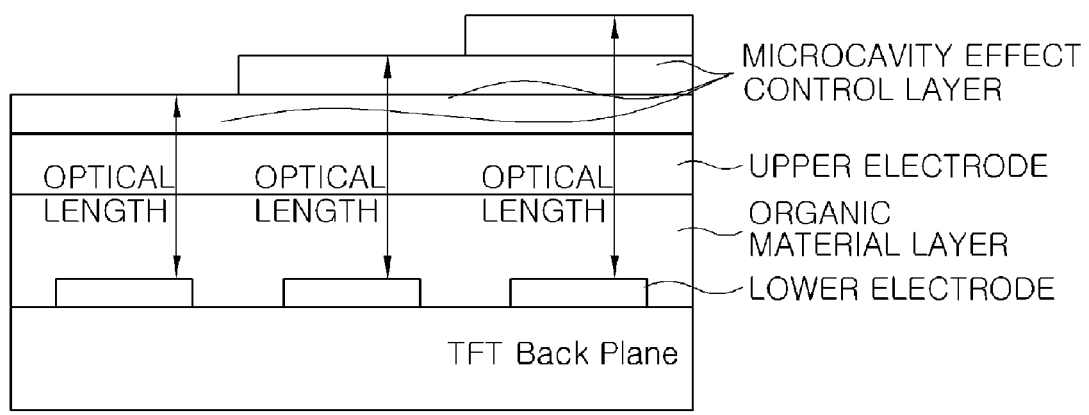

ORGANIC LIGHT-EMITTING DEVICE HAVING IMPROVED LIGHT-EMITTING EFFICIENCY AND METHOD FOR FABRICATING THE SAME

This application claims the benefit of PCT/KR2008/000752 filed on Feb. 5, 2008, and Korean Patent Application No. 10-2007-0011512 filed on Feb. 5, 2007, both of which are hereby incorporated herein by reference for all purposes in their entirety.

TECHNICAL FIELD

The present invention relates to an organic light emitting device and a method of manufacturing the same. More particularly, the present invention pertains to an organic light emitting device in which an optical length regarding the microcavity effect is easily controlled, and a method of manufacturing the same. This application claims priority from Korea Patent Application No. 10-2007-0011512 filed on Feb. 5, 2007 in the KIPO, the disclosure of which is incorporated herein by reference in its entirety.

BACKGROUND ART

Various types of organic light emitting devices are known in the known art, and may be used for different purposes. The organic light emitting device is classified into a top light emitting type organic light emitting device, a bottom light emitting type organic light emitting device, and a dual-sided light emitting type organic light emitting device. If the bottom light emitting type organic light emitting device is used in an active matrix display, a thin film transistor (TFT) is disposed at a top side of a light emitting source. Thus, a ratio (aperture ratio) of an effective display region is reduced.

The above-mentioned problems are serious in the case of when a sophisticated display requiring a large number of TFTs is manufactured. The bottom light emitting type organic light emitting device generally has the aperture ratio that is less than 40%. For example, the aperture ratio that is expected in a WXGA type display using TFTs for 14" grade may be less than 20%. This small aperture ratio negatively affects the consumption of driving power and a life span of the OLED.

The top light emitting type organic light emitting device may be used to solve the above problems. A known organic light emitting device is manufactured by sequentially layering an anode, an organic material layer, and a cathode on a substrate, and the metal that has a small work function is used as the material of the cathode. In the top light emitting type organic light emitting device, since the upper electrode is transparent, the cathode is formed to have a very small thickness so that visible rays can be passed through the metal. In addition, in the top light emitting type organic light emitting device, in order to maximize the output of light emitted through the top side, a reflective layer is provided at a lower part of the anode that is the lower electrode. The above-mentioned known top light emitting type organic light emitting device that includes the upper electrode used as the cathode and the reflective layer at a lower part of the lower electrode is shown in FIG. 1.

In the above-mentioned top light emitting type organic light emitting device, the upper electrode and the reflective layer that is provided at the lower part of the lower electrode act as mirrors, thus light that is emitted from the light emitting layer of the organic light emitting device is reflected by the mirrors. Accordingly, the destructive interference and the constructive interference of light occur, causing a phenomenon where only light having a predetermined wavelength is maintained and the intensity of light having the remaining wavelength is reduced. The phenomenon is called the microcavity effect. In the top light emitting type organic light emitting device, the light emitting spectrum is shifted or the color coordinate is changed due to the above phenomenon. In connection with this, a distance between the mirrors is called an optical length.

An effort has been made to control the optical length so that the optical interference intensity approaches the peak according to the type of color of emitted light. For example, Korean Unexamined Patent Application Publication No. 10-2005-0048412 discloses a method of controlling a thickness of an anode that is a lower electrode of an organic light emitting device (FIG. 2). However, when the thickness of the lower electrode is controlled according to the type of color of emitted light by using masks, the type of which depends on the type of color of emitted light, during a typical sputtering process in the course of forming the lower electrode, there are problems in that a life span of the mask is reduced and alien substances are generated during the process. In addition, an uneven structure that is caused by a nonuniform thickness of the lower part of light emitting layer according to the type of color of emitted light may reduce the stability of the whole manufacturing process of the device. Furthermore, in order to control the optical length, the thickness of the organic material layer of the organic light emitting device may be controlled (FIG. 3). In this case, there are problems in that it is difficult to perform the process and driving voltage is increased.

DISCLOSURE OF INVENTION

Technical Problem

The present inventors have found that in a top light emitting type organic light emitting device, even if an upper electrode having the transmittance of 80% or more in respects to light emitted from a light emitting layer of the device is used, the microcavity effect can be obtained due to a difference between the refractive indexes of the upper electrode and an air layer, and in this case, an optical length can be controlled by forming additional layer on the upper electrode. The organic light emitting device having the excellent light emitting efficiency can be provided by more easily controlling the optical length according to the above method as compared to a known art.

Therefore, it is an object of the present invention to provide an organic light emitting device in which an optical length is easily controlled so that the optimum microcavity effect is obtained according to the type of color of emitted light and a method of manufacturing the same.

Technical Solution

In order to accomplish the above object, the present invention provides an organic light emitting device that includes a lower electrode, one or more organic material layers including a light emitting layer, and an upper electrode. A layer having a refractive index in the range of 1.3 to 3 is further formed on the upper electrode of at least one region of regions through which rays having red, green, and blue colors are passed.

In the organic light emitting device according to the present invention, it is preferable that the upper electrode have the transmittance of 80% or more in respects to light emitted from the light emitting layer. Additionally, it is preferable that the upper electrode have a thickness of 500 Å or more. Furthermore, it is preferable that a difference between a refractive index of the upper electrode and a refractive index of the organic material layer that comes into contact with the upper electrode be less than 0.5.

In the organic light emitting device according to the present invention, it is preferable that the sum total of the thickness of the upper electrode and the thickness of a layer having the refractive index in the range of 1.3 to 3 be controlled according to the color of emitted light that is passed through the above layers.

It is preferable that in a region in which the color of emitted light that is passed through the above layers is red, the sum total of the thickness of the upper electrode and the thickness of the layer having the refractive index in the range of 1.3 to 3 be in the range of 10 to 400 nm. Furthermore, it is preferable that in a region in which the color of emitted light that is passed through the above layers is green, the sum total of the thickness of the upper electrode and the thickness of the layer having the refractive index in the range of 1.3 to 3 be in the range of 10 to 300 nm. Furthermore, it is preferable that in a region in which the color of emitted light that is passed through the above layers is blue, the sum total of the thickness of the upper electrode and the thickness of the layer having the refractive index in the range of 1.3 to 3 be in the range of 10 to 200 nm.

In addition, the present invention provides an electronic device or a lighting device that includes the above-mentioned organic light emitting device.

Furthermore, the present invention provides a method of manufacturing an organic light emitting device, which includes sequentially forming a lower electrode, one or more organic material layers including a light emitting layer, and an upper electrode on a substrate. A layer having a refractive index in the range of 1.3 to 3 is further formed on the upper electrode of at least one region of regions through which rays having red, green, and blue colors are passed.

Advantageous Effects

According to the present invention, in an organic light emitting device, a layer having a refractive index in the range of 1.3 to 3 is further formed on an upper electrode of at least one region of regions through which rays having red, green, and blue colors are passed. Thereby, an optical length regarding the microcavity effect can be easily controlled, and thus, the light emitting efficiency of the organic light emitting device can be easily improved.

BRIEF DESCRIPTION OF THE DRAWINGS

FIG. 1 is a view that illustrates the microcavity effect in a top light emitting type organic light emitting device;

FIGS. 2 and 3 are views that illustrate controlling of an optical length according to a known technology; and FIGS. 4 and 5 are sectional views of an example of an organic light emitting device according to the present invention.

BEST MODE FOR CARRYING OUT THE INVENTION

Hereinafter, the present invention will be described in detail.

In an organic light emitting device according to the present invention, in the case of when an upper electrode having the transmittance of 80% or more is used in respects to light that is emitted from a light emitting layer of the device, the microcavity effect may be obtained due to a difference between the refractive index of the upper electrode and the refractive index of an air layer. In this case, an upper limit of an optical length regarding the microcavity effect is an interface of the upper electrode and the air layer. Unlike this, in a known art, the upper electrode that has the low transmittance in respects to light and acts as the reflective layer is used as the above upper electrode. Thus, the upper limit of the optical length regarding the microcavity effect is the interface of the upper electrode and the organic material layer.

Due to a difference between the present invention and the above-mentioned known art, in the present invention, unlike the known art, an additional layer may be formed on the upper electrode to control the optical length. The above-mentioned method may be used to provide an organic light emitting device that has the excellent light emitting effect by easily controlling the optical length as compared to the case of the known art. In the present invention, in order to control the above optical length, the layer having the refractive index in the range of 1.3 to 3 is formed on the upper electrode.

If the refractive index is in the range of 1.3 to 3, light may reflect from the interface to the air layer. Thus, the microcavity effect can be obtained.

In the present invention, in order to control the optical length so that the microcavity effect can be maximized according to the type of wavelength of the color of emitted light, it is preferable that the sum total of the thickness of the upper electrode and the thickness of the layer having the refractive index in the range of 1.3 to 3 be appropriately controlled according to the type of wavelength of the color of emitted light that is passed through the upper electrode and the layer having the refractive index in the range of 1.3 to 3. In the region in which the color of emitted light that is passed through the above layers is red, it is preferable that the sum total of the thickness of the upper electrode and the thickness of the additional layer having the refractive index in the range of 1.3 to 3 be in the range of 10 to 400 nm. Furthermore, in the region in which the color of emitted light that is passed through the above layers is green, it is preferable that the sum total of the thickness of the upper electrode and the thickness of the additional layer having the refractive index in the range of 1.3 to 3 be in the range of 10 to 300 nm. Additionally, in the region in which the color of emitted light that is passed through the above layers is blue, it is preferable that the sum total of the thickness of the upper electrode and the thickness of the additional layer having the refractive index in the range of 1.3 to 3 be in the range of 10 to 200 nm.

In the case of when the sum total of the thicknesses of the above layers is less than 10 nm, the thicknesses of the layers may affect the conductivity required to be used as the electrode and the transmittance required to perform the top-light emission. In the case of when the sum total of the thicknesses of the above layers is more than 400 nm, 300 nm, and 200 nm in respects to the red, green, and blue transmission regions, the thicknesses of the layers may affect the transmittance required to perform the top-light emission.

The organic light emitting device according to the present invention may be a top light emitting type or a dual-sided light emitting type. However, in the present invention, it is preferable to use the top light emitting type. In addition, the organic light emitting device according to the present invention may have a normal structure in which the lower electrode is the anode and the upper electrode is the cathode or an inverted structure in which the lower electrode is the cathode and the upper electrode is the anode.

Hereinafter, elements that constitute the organic light emitting device according to the present invention will be described.

In the present invention, the type of layer having the refractive index in the range of 1.3 to 3 is not limited as long as the layer has the refractive index in the range of 1.3 to 3. Preferable examples of the material constituting the layer having the refractive index in the range of 1.3 to 3 include an organic substance, an inorganic substance, metal oxides, metal carbides, metal nitrides, metal oxynitrides, metal halides and the like. Specific examples thereof may include TCO (Transparent Conducting Oxide) such as ITO (indium tin oxide) and IZO (indium zinc oxide), titanium oxides, silicon nitrides, silicon oxynitrides, lithium fluorides, a compound that is represented by the following Formula 1, a compound having a functional group that is selected from the group consisting of an imidazole group, an oxazole group, and a thiazole group, NPB (4,4'-bis[N-(1-naphthyl)-N-phenylamino]biphenyl) and the like. The material of the layer having the refractive index in the range of 1.3 to 3 may be the same as that of the upper electrode.

[Formula 1]

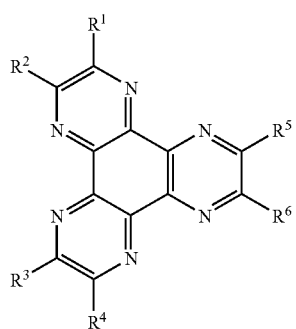

In the above Formula 1, $R^1$ to $R^6$ are each selected from the group consisting of hydrogen, a halogen atom, nitrile (—CN), nitro (—NO$_2$), sulfonyl (—SO$_2R^{11}$), sulfoxide (—SOR$^{11}$), sulfonamide (—SO$_2$NR$^{11}$R$^{12}$), sulfonate (—SO$_3$R$^{11}$), trifluoromethyl (—CF$_3$), ester (—COOR$^{11}$), amide (—CONHR$^{11}$ or —CONR$^{11}$R$^{12}$), substituted or unsubstituted and straight- or branched-chained $C_1$-$C_{12}$ alkoxy, substituted or unsubstituted and straight- or branched-chained $C_1$-$C_{12}$ alkyl, substituted or unsubstituted and aromatic or nonaromatic hetero cycles, substituted or unsubstituted aryl, substituted or un-substituted mono- or di-arylamine, and substituted or unsubstituted aralkyl amine, and $R^{11}$ and $R^{12}$ are each selected from the group consisting of substituted or unsubstituted $C_1$-$C_{60}$ alkyl, substituted or unsubstituted aryl, and substituted or unsubstituted 5- to 7-membered hetero cycles.

Specific examples of the compound that is represented by the above Formula 1 include the compounds that are represented by the following Formulae 11 to 16, but are not limited thereto.

[Formula 11]

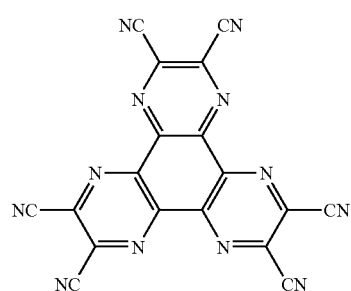

[Formula 12]

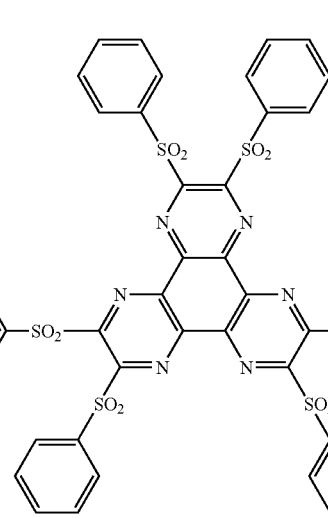

[Formula 13]

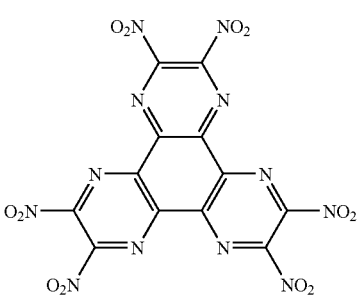

[Formula 14]

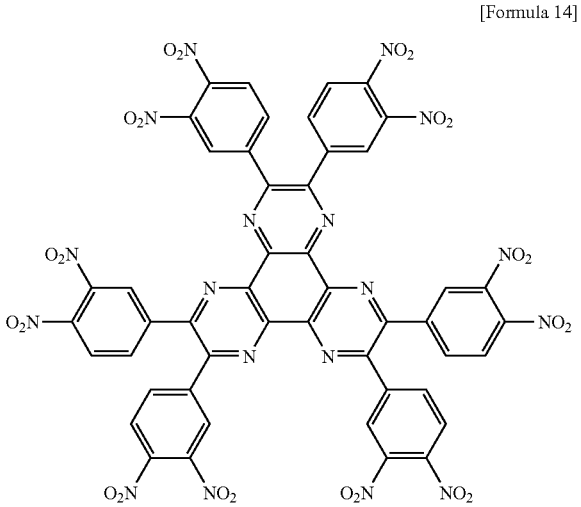

[Formula 15]

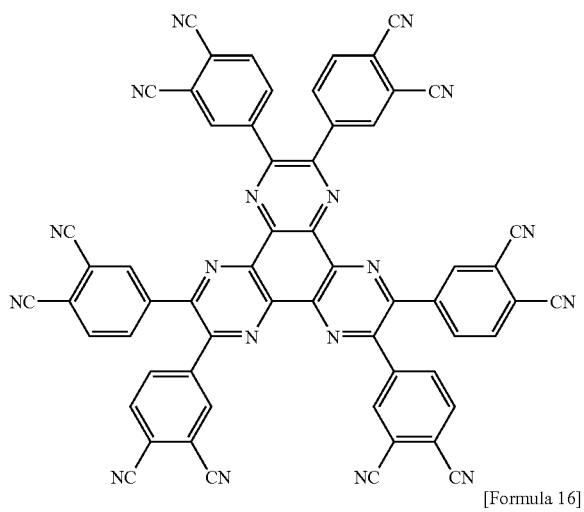

[Formula 16]

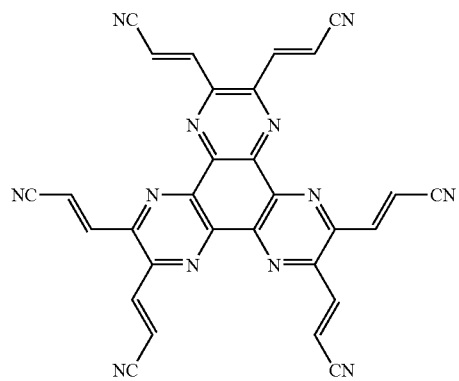

Examples of the compound that has the functional group selected from the group consisting of the imidazole group, the oxazole group and the thiazole group include the compound that is represented by the following Formula 2.

[Formula 2]

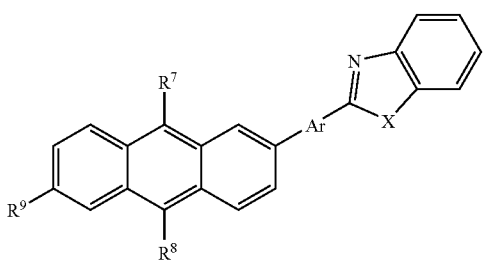

In the above Formula 2, $R^7$ and $R^8$ are the same as or different from each other, and are each independently hydrogen, $C_1$-$C_{20}$ aliphatic hydrocarbon, an aromatic cycle or an aromatic hetero cycle; Ar is an aromatic cycle or an aromatic hetero cycle; $R^9$ is hydrogen, $C_1$-$C_6$ aliphatic hydrocarbon, an aromatic cycle or an aromatic hetero cycle; and X is O, S or $NR^{13}$; $R^{13}$ is hydrogen, $C_1$-$C_7$ aliphatic hydrocarbon, an aromatic cycle or an aromatic hetero cycle, with a proviso that both $R^7$ and $R^8$ are not hydrogen.

Examples of the compound that is represented by the above Formula 2 include the compound that is represented by the following Formula 21, but are not limited thereto.

[Formula 21]

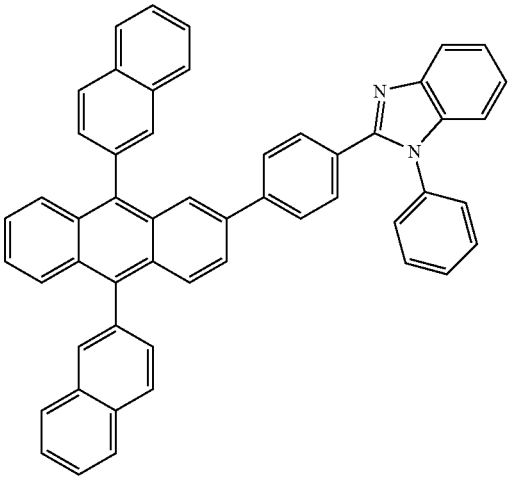

The above layer having the refractive index in the range of 1.3 to 3 may be formed by using thermal deposition, wet deposition, sputtering, CVD (Chemical Vapor Deposition), LITI (Laser Induced Thermal Imaging), a printing process or the like. The different layers each having the refractive index in the range of 1.3 to 3 may be formed in respects to the different regions of the colors of emitted light as shown in FIG. 4, or the single layer may be formed in respects to the same region of the color of emitted light as shown in FIG. 5.

The organic light emitting device according to the present invention may be produced by using a material and a method that are known in the art, except that the layer having the refractive index in the range of 1.3 to 3 is further provided.

In the present invention, the lower electrode may be an anode or a cathode. In the case of when the lower electrode is the anode, the lower electrode may be made of a material having a large work function so that the holes are easily injected into the organic material layer. Specific examples of the material include metal such as vanadium, chrome, copper, zinc, gold and the like or an alloy thereof; metal oxides such as zinc oxides, indium oxides, indium tin oxides (ITO), indium zinc oxide (IZO) and the like; a combination of metal and oxides, such as ZnO:Al or $SnO_2$:Sb; a conductive polymer such as poly(3-methylthiophene), poly[3,4-(ethylene-1,2-dioxy)thiophene] (PEDT), polypyrrole, polyaniline and the like, but are not limited thereto. In the case of when the lower electrode is the cathode, the lower electrode may be made of a material having a small work function so that the electrons are easily injected into the organic material layer. Specific examples of the material include metal such as magnesium, calcium, sodium, potassium, titanium, indium, yttrium, lithium, gadolinium, aluminum, silver, tin, lead and the like, or an alloy thereof; or a multilayered material such as LiF/Al or $LiO_2$/Al, but are not limited thereto.

In the present invention, the upper electrode may be the cathode or the anode. In the case of when the upper transparent electrode is the cathode, the upper transparent electrode may be made of a material having the small work function so that the electrons are easily injected into the organic material layer. Specific examples of the material include metal such as magnesium, calcium, sodium, potassium, titanium, indium, yttrium, lithium, gadolinium, aluminum, silver, tin, lead and the like, or an alloy thereof; or a multilayered material such as LiF/Al or $LiO_2$/Al, but are not limited thereto. In the case of when the upper electrode is the anode, the upper electrode may be made of a material having the large work function so that the holes are easily injected into the organic material layer. Specific examples of the material include metal such as vanadium, chrome, copper, zinc, gold and the like or an alloy thereof; metal oxides such as zinc oxides, indium oxides, indium tin oxides (ITO), indium zinc oxide (IZO) and the like; a combination of metal and oxides, such as ZnO:Al or SnO$_2$:Sb; a conductive polymer such as poly(3-methylthiophene), poly[3,4-(ethylene-1,2-dioxy)thiophene] (PEDT), polypyrrole, polyaniline and the like, but are not limited thereto. However, in the case of when the upper electrode is made of an opaque material such as metal, the upper electrode must be formed to have a small thickness and to be transparent.

It is preferable that the above upper electrode have the transmittance of 80% or more in respects to light emitted from the above light emitting layer and the upper electrode have a thickness of 500 Å or more. The thickness of the upper electrode may be set to be 5,000 Å or less, but may be controlled according to the process that is known in the art.

In addition, it is preferable that a difference between a refractive index of the upper electrode and a refractive index of the organic material layer that comes into contact with the upper electrode be less than 0.5. When the difference between the refractive index of the upper electrode and the refractive index of the organic material layer that comes into contact with the upper electrode is less than 0.5, it is possible to prevent the occurrence of total reflection between the upper electrode and the organic material layer.

In the present invention, the above organic material layer may have a multilayer structure that includes a hole injection layer, a hole transport layer, a light emitting layer, an electron transport layer and the like. However, the structure of the organic material layer is not limited thereto, but is a single layer structure. In addition, the organic material layer may be produced by means of various types of polymer materials by using not a deposition method but a solvent process such as spin coating, dip coating, doctor blading, screen printing, inkjet printing, heat transfer method or the like so that the organic material layer has a small number of layers.

The hole injecting material is a material that is capable of desirably receiving a hole from an anode at low voltage. It is preferable that the HOMO (highest occupied molecular orbital) level of the hole injecting material be located between the work function of the anode material and the HOMO level of its neighboring organic material layer. Specific examples of the hole injecting material include, but are not limited to metal porphyrin, oligothiophene, and arylamine-based organic materials, hexanitrile hexaazatriphenylene and quinacridone-based organic materials, perylene-based organic materials, anthraquinone, polyaniline-based or polythiophene-based conductive polymers and the like.

The hole transporting material is suitably a material having high hole mobility, which is capable of transferring holes from the anode or the hole injection layer toward the light emitting layer. Specific examples of the hole transporting material include, but are not limited to arylamine-based organic materials, conductive polymers, and block copolymers having both conjugated portions and non-conjugated portions.

The light emitting material is a material capable of emitting visible light by accepting and recombining holes from the hole transport layer and electrons from the electron transport layer, and preferably a material having high quantum efficiency for fluorescence and phosphorescence. Specific examples of the light emitting material include, but are not limited to 8-hydroxyquinoline aluminum complex (Alq$_3$); carbazole-based compounds; dimerized styryl compounds; BAlq; 10-hydroxybenzoquinoline-metal compounds; compounds of benzoxazole, benzthiazole, and benzimidazole series; polymers of poly(p-phenylenevinylene) (PPV) series; spiro compounds; and compounds of polyfluorene and rubrene series.

The electron transport material is suitably a material having high electron mobility, which is capable of transferring electrons from the cathode to the light emitting layer. Specific examples of the electron transport material include, but are not limited to 8-hydroxyquinoline aluminum complex; complexes including Alq$_3$; organic radical compounds; and hydroxyflavone-metal complexes.

Furthermore, the present invention includes an electronic device or a lighting device that includes the above-mentioned organic light emitting device. Examples of the above electronic device include displays, display devices and the like, but are not limited thereto.

The invention claimed is:

1. An organic light emitting device comprising:
a lower electrode;
one or more organic material layers including a light emitting layer; and
an upper electrode,
wherein a layer having a refractive index in the range of 1.3 to 3 is further formed on the upper electrode of at least one region of regions through which rays having red, green, and blue colors are passed, respectively, and an optical length that causes a microcavity effect is the length between the upper surface of the lower electrode and the upper surface of the layer having the refractive index in the range of 1.3 to 3; and
wherein the upper electrode is an anode and the lower electrode is a cathode, or the upper electrode is a cathode and the lower electrode is an anode.

2. The organic light emitting device as set forth in claim 1, wherein the upper electrode has a transmittance of 80% or more.

3. The organic light emitting device as set forth in claim 2, wherein the upper electrode has a thickness of 500 Å or more.

4. The organic light emitting device as set forth in claim 1, wherein a difference between a refractive index of the upper electrode and a refractive index of the organic material layer that comes into contact with the upper electrode is less than 0.5.

5. The organic light emitting device as set forth in claim 1, wherein the sum total of the thickness of the upper electrode and the thickness of a layer having the refractive index in the range of 1.3 to 3 is controlled according to the color of emitted light that is passed through the upper electrode and the layer having the refractive index in the range of 1.3 to 3.

6. The organic light emitting device as set forth in claim 1, wherein in a region in which the color of emitted light that is passed through the upper electrode and the layer having the refractive index in the range of 1.3 to 3 is red, the sum total of the thickness of the upper electrode and the thickness of the layer having the refractive index in the range of 1.3 to 3 is in the range of 10 to 400 nm.

7. The organic light emitting device as set forth in claim 1, wherein in a region in which the color of emitted light that is passed through the upper electrode and the layer having the refractive index in the range of 1.3 to 3 is green, the sum total of the thickness of the upper electrode and the thickness of the layer having the refractive index in the range of 1.3 to 3 is in the range of 10 to 300 nm.

8. The organic light emitting device as set forth in claim 1, wherein in a region in which the color of emitted light that is passed through the upper electrode and the layer having the refractive index in the range of 1.3 to 3 is blue, the sum total of the thickness of the upper electrode and the thickness of the layer having the refractive index in the range of 1.3 to 3 is in the range of 10 to 200 nm.

9. The organic light emitting device as set forth in claim 1, wherein the layer having the refractive index in the range of 1.3 to 3 is made of a material that is selected from the group consisting of an organic substance, an inorganic substance, metal oxides, metal carbides, metal nitrides, metal oxynitrides, and metal halides.

10. The organic light emitting device as set forth in claim 9, wherein the layer having the refractive index in the range of 1.3 to 3 is made of a material that is selected from the group consisting of TCO (Transparent Conducting Oxide), titanium oxides, silicon nitrides, silicon oxynitrides, lithium fluorides, a compound that is represented by the following Formula 1, a compound having a functional group that is selected from the group consisting of an imidazole group, an oxazole group, and a thiazole group, and NPB (4,4'-bis[N-(1-naphthyl)-N-phenylamino]biphenyl):

[Formula 1]

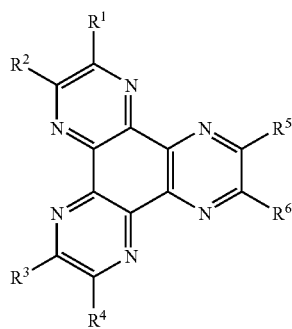

wherein $R^1$ to $R^6$ are each selected from the group consisting of hydrogen, a halogen atom, nitrile (—CN), nitro (—NO$_2$), sulfonyl (—SO$_2R^{11}$), sulfoxide (—SOR$^{11}$), sulfonamide (—SO$_2$NR$^{11}$R$^{12}$), sulfonate (—SO$_3$R$^{11}$), trifluoromethyl (—CF$_3$), ester (—COOR$^{11}$), amide (—CONHR$^{11}$ or —CONR$^{11}$R$^{12}$), substituted or unsubstituted and straight- or branched-chained $C_1$-$C_{12}$ alkoxy, substituted or unsubstituted and straight- or branched-chained $C_1$-$C_{12}$ alkyl, substituted or unsubstituted and aromatic or nonaromatic hetero cycles, substituted or unsubstituted aryl, substituted or unsubstituted mono- or di-arylamine, and substituted or unsubstituted aralkyl amine, and $R^{11}$ and $R^{12}$ are each selected from the group consisting of substituted or unsubstituted $C_1$-$C_{60}$ alkyl, substituted or unsubstituted aryl, and substituted or unsubstituted 5- to 7-membered hetero cycles.

11. The organic light emitting device as set forth in claim 1, wherein the layer having the refractive index in the range of 1.3 to 3 is made of a material that is the same as a material of the upper electrode.

12. An electronic device that includes the organic light emitting device according to claim 1.

13. A lighting device that includes the organic light emitting device according to claim 1.

14. A method of manufacturing an organic light emitting device, the method comprising:
sequentially forming a lower electrode, one or more organic material layers including a light emitting layer, and an upper electrode on a substrate,
wherein a layer having a refractive index in the range of 1.3 to 3 is further formed on the upper electrode of at least one region of regions through which rays having red, green, and blue colors are passed, respectively, and an optical length that causes a microcavity effect is the length between the upper surface of the lower electrode and the upper surface of the layer having the refractive index in the range of 1.3 to 3; and
wherein the upper electrode is an anode and the lower electrode is a cathode, or the upper electrode is a cathode and the lower electrode is an anode.

15. The method of manufacturing an organic light emitting device as set forth in claim 14, wherein the sum total of the thickness of the upper electrode and the thickness of the layer having the refractive index in the range of 1.3 to 3 is controlled according to the color of emitted light that is passed through the upper electrode and the layer having the refractive index in the range of 1.3 to 3.

16. The method of manufacturing an organic light emitting device as set forth in claim 14, wherein in a region in which the color of emitted light that is passed through the upper electrode and the layer having the refractive index in the range of 1.3 to 3 is red, the sum total of the thickness of the upper electrode and the thickness of the layer having the refractive index in the range of 1.3 to 3 is controlled to be in the range of 10 to 400 nm.

17. The method of manufacturing an organic light emitting device as set forth in claim 14, wherein in a region in which the color of emitted light that is passed through the upper electrode and the layer having the refractive index in the range of 1.3 to 3 is green, the sum total of the thickness of the upper electrode and the thickness of the layer having the refractive index in the range of 1.3 to 3 is controlled to be in the range of 10 to 300 nm.

18. The method of manufacturing an organic light emitting device as set forth in claim 14, wherein in a region in which the color of emitted light that is passed through the upper electrode and the layer having the refractive index in the range of 1.3 to 3 is blue, the sum total of the thickness of the upper electrode and the thickness of the layer having the refractive index in the range of 1.3 to 3 is controlled to be in the range of 10 to 200 nm.

* * * * *